United States Patent
Zheng et al.

(10) Patent No.: US 6,744,675 B1
(45) Date of Patent: *Jun. 1, 2004

(54) PROGRAM ALGORITHM INCLUDING SOFT ERASE FOR SONOS MEMORY DEVICE

(75) Inventors: Wei Zheng, Santa Clara, CA (US); Mark W. Randolph, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 14 days.

This patent is subject to a terminal disclaimer.

(21) Appl. No.: 10/305,756

(22) Filed: Nov. 26, 2002

(51) Int. Cl.$^7$ .............................................. G11C 16/00
(52) U.S. Cl. ............................ 365/185.28; 365/185.22; 365/185.18
(58) Field of Search ....................... 365/185.28, 385.22, 365/385.18

(56) References Cited

U.S. PATENT DOCUMENTS 6,269,023 B1 * 7/2001 Derhacobian et al. . 365/185.24

* cited by examiner

*Primary Examiner*—Tan T. Nguyen
(74) *Attorney, Agent, or Firm*—Renner, Otto, Boisselle & Sklar, LLP

(57) ABSTRACT

In a non-volatile SONOS-type memory device having a charge storing layer disposed between top and bottom dielectric layers, a method of programming the memory device includes selectively storing charge in an upper portion of the charge storing layer. The method includes performing a channel hot electron injection procedure followed by a soft erase operation in which charge within a bottom portion of the first charging cell is removed. A verification procedure is performed to determine whether at least one charge storing cell is in a programmed state. The method provides a programmed cell in which the stored charge is disposed adjacent an upper portion of the cell near the top dielectric.

17 Claims, 3 Drawing Sheets

PROGRAM ALGORITHM INCLUDING SOFT ERASE FOR SONOS MEMORY DEVICE

TECHNICAL FIELD

The present invention relates generally to the field of non-volatile memory devices and, more particularly, to a method of programming a flash memory device, such as a semiconductor/oxide-nitride-oxide on semiconductor (SONOS) type electrically erasable programmable read only memory (EEPROM).

BACKGROUND

A pervasive trend in modern integrated circuit manufacture is to increase the number of bits stored per unit area on an integrated circuit memory core that contains memory devices (sometimes referred to as memory cells), such as flash electrically erasable programmable read only memory (EEPROM) devices. For instance, a conventional semiconductor/oxide-nitride-oxide on semiconductor (SONOS) type memory device is capable of storing two bits of data in "double-bit" format. That is, one bit can be stored using a memory cell on a first side of the memory device and a second bit can be stored using a memory cell on a second side of the memory device.

An example of a conventional non-volatile SONOS-type memory cell includes a semiconductor substrate with a source and a drain (typically having N-type conductivity) formed therein. A body is formed between the source and the drain. An oxide-nitride-oxide (ONO) dielectric stack is formed above the body. A polysilicon gate electrode is formed over the ONO stack. The ONO stack includes a first or bottom dielectric layer (often referred to as a bottom tunnel oxide), a charge storing layer, and a second or top dielectric layer.

Programming of such a SONOS device can be accomplished, for example, by hot electron injection. Hot electron injection involves applying appropriate voltage potentials to each of the gate, the source, and the drain of the SONOS memory cell for a specified duration until the charge storing layer accumulates charge. Such a process, with respect to a NOR architecture SONOS device is disclosed in co-owned U.S. Pat. No. 6,215,702, which is incorporated herein by reference in its entirety.

During hot electron injection, each of the charge storing cells within the charge storing layer are programmed by applying appropriate potentials to the source, drain, and/or gate electrode. The applied potentials generate a vertical electric field through the top and bottom dielectric layers and the charge storing layer as well as a lateral electric field along the length of a channel, which extends from the source to the drain, within the body. The lateral electric field causes electrons to be drawn off of the source and begin accelerating toward the drain. As electrons move along the length of the channel, the electrons gain energy and, upon attaining enough energy, jump over the potential barrier of the bottom dielectric layer and into the charge storing layer (within the respective charge storing cells) where the electrons become trapped.

While conventional hot electron injection provides control over the lateral location of the stored charge within the charge storing layer, it is nearly impossible to control the position of the deposited charge along the height dimension of the device (i.e., the position within the charge storing layer along the vertical direction). In other words, charge is stored within each charge storing cell along both a top portion of each cell (i.e., the portion adjacent the top dielectric layer) as well as along a bottom portion of each cell (i.e., the portion adjacent the bottom dielectric layer).

One of the most important concerns with EEPROM cells is data retention capability. Data retention is defined as the length of time a particular cell can retain information stored in the form of charge within the charge storing layer. Charge stored near the interface between the charge storing layer and the bottom dielectric is more easily lost during storage, especially in memory devices employing very thin bottom dielectric layers. This loss of charge occurs due to a "low voltage leakage current," which arises when electrons within the charge storing layer traverse the bottom dielectric when no voltage is applied to the device. This small amount of leakage current may ultimately lead to total discharge of the cell.

Accordingly, there is an ever increasing demand to store data in memory devices, while increasing the data retention and reliability of the device.

SUMMARY OF THE INVENTION

According to one aspect of the invention, the invention is directed to a method of programming a memory device. The device can include a charge storing layer having a first charge storing cell and a second charge storing cell. The charge storing layer can be disposed between a top dielectric layer and a bottom dielectric layer. The charge storing layer can include an upper portion, which is disposed adjacent the top dielectric layer, and a lower portion, which is disposed adjacent the bottom dielectric layer. A gate electrode can be disposed over the top dielectric layer with the bottom dielectric layer being disposed over a substrate having a first conductive region adjacent the first charge storing cell and a second conductive region adjacent the second charge storing cell. The method includes programming the first charge storing cell by selectively storing charge in the upper portion of the first charge storing cell, such that substantially all of the charge resides within the upper portion of the first charge storing cell and substantially no charge resides within the lower portion of the first charge storing cell.

According to another aspect of the invention, the invention is directed to a method of selectively storing charge within an upper portion of a charge storing layer of a non-volatile memory device. The memory device can include a charge storing layer, which is disposed between a top dielectric layer and a bottom dielectric layer. A gate electrode can be disposed over the top dielectric layer, while the bottom dielectric layer is disposed over a substrate. A source and a drain can be disposed within the substrate. The method includes performing a channel hot electron injection procedure, where the channel hot electron injection procedure is operative to write charge into at least one charge storing cell within the charge storing layer, the charge storing cell having an upper portion disposed adjacent the top dielectric layer and a bottom portion disposed adjacent the bottom dielectric layer. A soft erase procedure is performed to selectively remove charge from the bottom portion of the at least one charge storing cell.

In accordance with another aspect of the present invention, the method can include performing a verification procedure to determine whether a predetermined desired quantity of charge remains in the upper portion of the at least one charge storing cell. In response to the verification procedure, if less than the desired quantity of charge remains in the upper portion of the at least one charge storing cell, the channel hot electron injection procedure, the soft erase procedure, and the verification procedure are each repeated.

BRIEF DESCRIPTION OF DRAWINGS

These and further features of the present invention will be apparent with reference to the following description and drawings, wherein.

DISCLOSURE OF INVENTION

Figure 1:
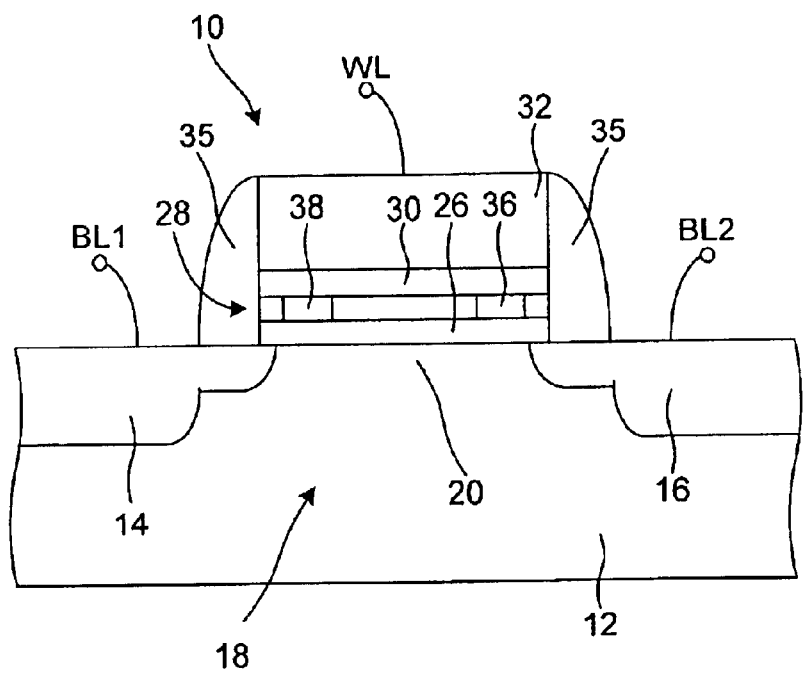
FIG. 1 is a schematic cross-section illustration of a conventional SONOS-type memory device to be programmed in accordance with the present invention.

In the detailed description that follows, corresponding components have been given the same reference numerals regardless of whether they are shown in different embodiments of the present invention. To illustrate the present invention in a clear and concise manner, the drawings may not necessarily be to scale and certain features may be shown in somewhat schematic form.

With reference to FIG. 1, an embodiment of a "double-bit", semiconductor/oxide-nitride-oxide on semiconductor (SONOS) type, non-volatile, flash electrically erasable programmable read only memory (EEPROM) memory device 10 is illustrated. The memory device 10 includes a semiconductor substrate 12. In one embodiment, the substrate 12 can initially be doped to have P-type conductivity (e.g., P dopant concentration). Within the substrate 12, an N-type conductivity (e.g., $N^+$ dopant concentration) source 14 and an N-type conductivity (e.g., $N^+$ dopant concentration) drain 16 are formed.

A body 18 is disposed between the source 14 and the drain 16. The substrate 12, the source 14, the drain 16 and the body 18 can be formed, for example, from a semiconductor such as appropriately doped silicon, germanium or silicon-germanium. Alternatively, an isolated P-well can be formed on the substrate, which allows for an electric bias to be applied to the isolated P-well during erase operations. In this embodiment, the memory device sits inside the isolated P-well.

Above the body 18 is a dielectric layer (also referred to as a tunneling oxide layer or bottom dielectric layer 26) that is made from, for example, silicon oxide ($SiO_2$), other standard-K material (e.g., having a relative permittivity below ten) or a high-K material (e.g., having a relative permittivity, in one embodiment above ten, and in another embodiment above twenty). In one embodiment, the bottom dielectric layer 26 has a thickness of about 60 Å to about 80 Å. Alternatively, the bottom dielectric layer 26 has a thickness of about 40 Å to about 60 Å. Of course, it will be appreciated that other thicknesses are possible.

Over the bottom dielectric layer 26 is a charge trapping layer (also referred to as a charge storing layer 28). The charge storing layer 28 can be made from, for example, a non-conductive material including silicon nitride ($Si_3N_4$), silicon oxide with varied polysilicon islands, implanted oxide and the like.

Over the charge storing layer 28 is another dielectric layer (also referred to as a top dielectric layer 30) made from a material such as, for example, silicon oxide, other standard-K material or a high-K material. The top dielectric can have a thickness of, for example, about 100 Å to about 120 Å. Over the top dielectric layer 30 is a gate electrode 32. The gate electrode can be made from, for example, polycrystalline silicon ("poly") or another appropriate material, such as a metal or metal oxide.

The gate electrode 32, the top dielectric layer 30, the charge storing layer 28 and the bottom dielectric layer 26 form a gate stack. Optional liners (not shown) and/or sidewall spacers 35 can be disposed adjacent lateral sidewalls of the gate stack for use in controlling dopant implantation, device properties, and the like. The potential of the gate controls a channel 20 within the body 18. The channel 20 extends from the source 14 to the drain 16. As one skilled in the art will appreciate, modifications to the gate stack and formation of the source 14, the drain 16, and the channel 20 can be made. Such modifications can include changes to the physical arrangement of the device, materials used, doping parameters and the like. It is to be appreciated that the programming techniques described herein can be used in conjunction with such a modified device.

The memory device 10 is operatively arranged to be programmed, read and erased by the application of appropriate voltage potentials to each of the gate electrode 32, the source 14 and the drain 16. More specifically, the gate electrode 32 can be coupled to a word line (WL), the source 14 can be coupled to a first bit line (BL1) and the drain 16 can be coupled to a second bit line (BL2) for applying the various voltage potentials to the corresponding components of the memory device 10.

In one embodiment, the memory device 10 can be configured as a virtual ground device. That is, the memory device 10 is connected in series with adjacent memory devices (not shown), such that the source 14 can be formed from a conductive region that also forms a drain of the adjacent memory device. Similarly, the drain 16 can be formed from a conductive region that also forms the source of a memory device (not shown) disposed adjacent the drain 16 side of the memory device 10. It is noted that the source and drain of adjacent memory devices need not be formed from a single conductive region, but can be formed from separate structures that are electrically connected together (e.g., a pair of conductive regions spaced apart by a trench isolation region and connected by a conductive layer, such as silicide).

As will become more apparent from the discussion below, within the charge storing layer 28, the memory device 10 includes a first charge storing region or cell (also referred to herein as a first cell or normal bit 36) adjacent the drain 16 and a second charge storing region or cell (also referred to herein as a second cell or complementary bit 38) adjacent the source 14.

In the illustrated embodiment, the memory device 10 is a symmetrical device allowing for programming, reading and erasing of the first cell 36 and the second cell 38 by respectively switching the roles of the source 14 and drain 16 during those operations.

With additional reference to FIG. 2 and FIGS. 3–5, a method of programming one or both of the charge storing cells 36 and 38 from a blank state (e.g., representing a binary value of "1") to a charged or programmed state (e.g., representing a binary value of "0") will be described. It is noted that the blank state corresponds to an amount of charge being stored by the charge storing cell 36, 38 that, during a read operation, would place a threshold voltage (Vt) of the memory cell 10 equal to or less than an erase threshold voltage. The programmed state corresponds to an amount of charge being stored by the charge storing cell 36, 38 that, during the read operation, would place the threshold voltage of the memory cell 10 within a threshold voltage distribution that is higher than the erase threshold voltage. In one embodiment, the memory cell 10 can be programmed using multi-level cell (MLC) programming. MLC programming can be accomplished by programming each charge storage cell 36, 38 with an amount of charge selected from one of a plurality of distinguishable amounts of charge, referred to as program levels.

Figure 2:
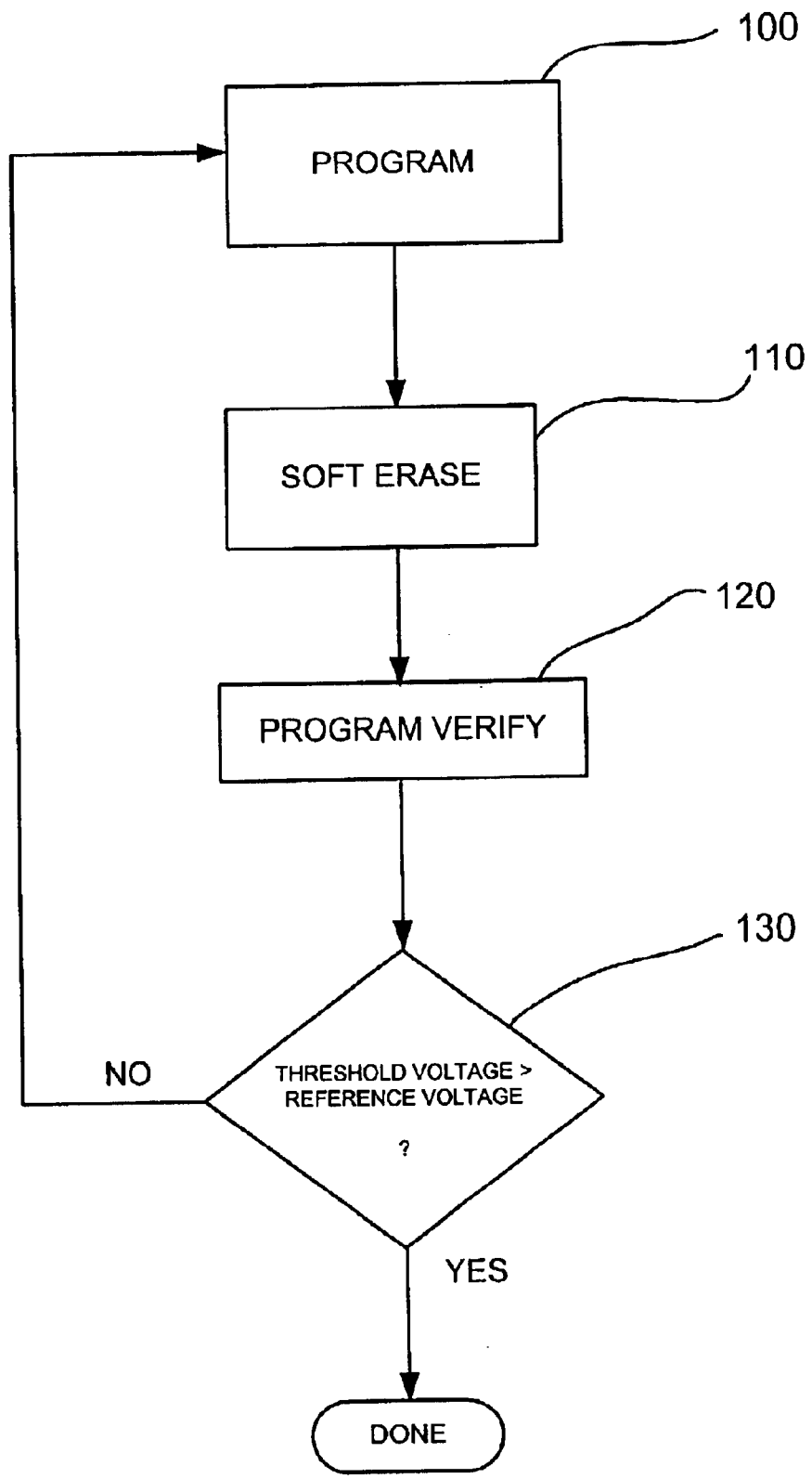
FIG. 2 is a flow chart of a programming method in accordance with the present invention.

The method illustrated in FIG. 2 begins with programming step 100 in which a predetermined amount of charge is written or programmed into, for example, the first charge storing cell 36. For purposes of the present disclosure, the programming step 100 includes channel hot electron injection (CHE). However, other programming techniques, such as hot hole injection, carrier tunneling and so forth are meant to fall within the scope of the present invention.

Using the hot electron injection technique to program the first charge storing cell 36, appropriate voltage potentials are applied to the source 14, drain 16 and/or the gate electrode 32. The applied potentials generate a vertical electric field through the dielectric layers 26, 30 and the charge storing layer 28 and a lateral electric field along the length of the channel 20 from the source 14 to the drain 16.

The lateral electric field causes electrons to be drawn off the source 14 and begin accelerating toward the drain 16. As the electrons move along the length of the channel 20, the electrons gain energy and upon attaining enough energy, the electrons jump over the potential barrier of the bottom dielectric layer 26 and into the charge storing layer 28, where the electrons become trapped.

The probability of electrons jumping the potential barrier is a maximum in the area of the first charge storing cell 36 adjacent the drain 16, where the electrons have gained the most energy. These accelerated electrons are termed hot electrons and once injected into the charge storing layer 28, stay in the first charge storing cell 36 of the charge storing layer 28. The trapped electrons tend not to spread through the charge storing layer 28 due to the low conductivity and low lateral electric field therein. Thus, the trapped charge remains in the localized trapping region the first charge storing cell 36 close to the drain 16.

The foregoing technique to program or otherwise store charge within the first charge storing cell 36 can be used to program the second charge storing cell 38, where the functions of the source 14 and the drain 16 are reversed. More specifically, appropriate voltages are applied to the source 14, the drain 16 and/or the gate electrode 32 such that the drain 16 functions as a source of electrons that travel along the channel 20 from the drain 16 towards the source 14. Accordingly, the terms source and drain can be used interchangeably. As the electrons move along the length of the channel 20, the electrons gain energy and upon attaining enough energy, the electrons jump over the potential barrier of the bottom dielectric layer 26 and into the charge storing layer 28, where the electrons become trapped. The probability of the hot electrons jumping the potential barrier is a maximum in the area of the second charge storing cell 38 adjacent the source 14, where the electrons have gained the most energy.

Table 1 includes exemplary voltage potentials and pulse durations that can be applied to the gate electrode 32, the source 14 and the drain 16 during programming step 100 to program the charge storage regions 36, 38. It is noted that the values presented in Table 1 will vary depending on the specific characteristics of the memory device 10 being programmed.

TABLE 1

|  | Gate Voltage | Source Voltage | Drain Voltage | Pulse Length |
| --- | --- | --- | --- | --- |
| First Cell | 9–10 volts | 0 volts | 4–6 volts | 1 µs |
| Second Cell | 9–10 volts | 4–6 volts | 0 volts | 1 µs |

Figure 3:
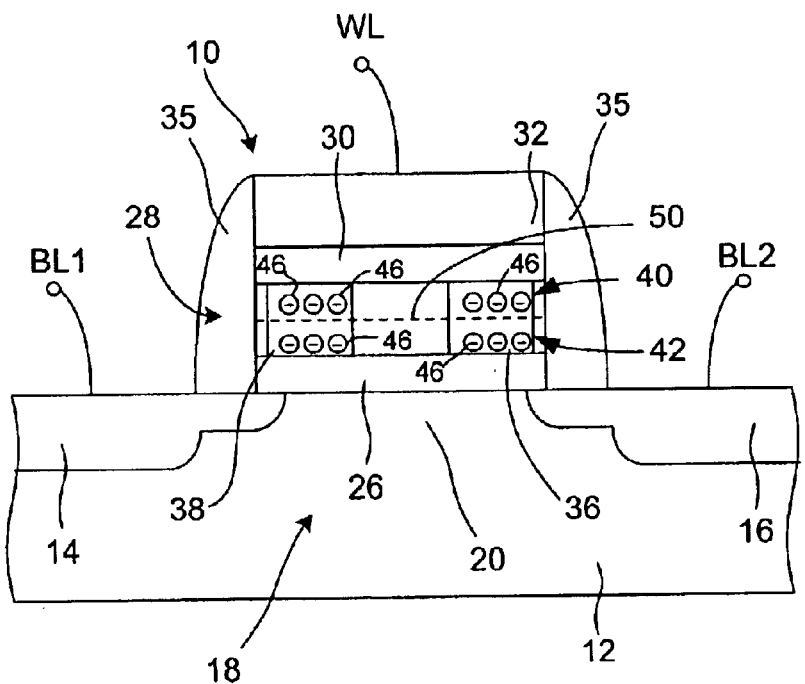
FIG. 3 is a schematic cross-section illustration of a SONOS-type memory device after a first programming step in accordance with the present invention.

FIG. 3 provides a schematic illustration of the position of electrons 46 within the charge storing cells 36, 38 in charge storing layer 28 after programming step 100. It is to be appreciated that charge storing layer 28 has a finite thickness or height. While hot electron injection provides lateral control over where hot electrons will be injected into the charge storing layer 28 (i.e., laterally within charge storing cells 36, 38), there is no control over the depth (i.e., the vertical position) into which the electrons will be injected and ultimately stored within the charge storing layer 28. More particularly, as shown in FIG. 3, the charge storing cells 36, 38 within the charge storing layer 28 have an upper portion 40, which is disposed adjacent the top dielectric layer 30, and a lower portion 42, which is disposed adjacent the bottom dielectric layer 26, on opposite sides of line 50. It is to be appreciated that no physical partition (e.g., line 50) exists within charge storing layer 28. Rather, line 50 is shown for purposes of explanation only. Therefore, after programming step 100, electrons exist in both the upper portion 40 and the lower portion 42 of one or both of charge storing cells 36, 38.

Referring again to FIG. 2, the programming method includes soft erase step 110. It is to be appreciated that the term "soft erase," as used herein, refers to a "weak" erase operation in which a portion of the charge programmed into charge storing cells 36, 38 is removed by the application of appropriate voltage potentials to one or more of the source 14, drain 16, and/or gate electrode 32.

In one embodiment, a portion of the charge programmed into charge storing cell 36 is removed by applying a negative gate erase voltage to the gate electrode 32 together with a small positive voltage to the drain 16, while allowing the source 14 to float or grounding the source 14. In one embodiment, the negative gate erase voltage ranges from about −4 volts to about −10 volts, while the voltage on the source 14 or drain 16 ranges from about 0 volts to about +2 volts. In this embodiment, for example, the soft erase 110 is accomplished using negative gate erase pulses having a duration in the range of about 1 ms to about 100 ms. However, it is to be appreciated that other appropriate voltages may be applied in order to achieve the desired soft erase operation. In another embodiment, a portion of the charge within both charge storing cells 36, 38 is removed simultaneously by applying a negative gate erase voltage to the gate electrode 32 and a small positive voltage to both the source 14 and the drain 16, and grounding the substrate 12. In addition, it is to be appreciated that other soft erase operations besides a negative gate erase may be employed.

Figure 4:
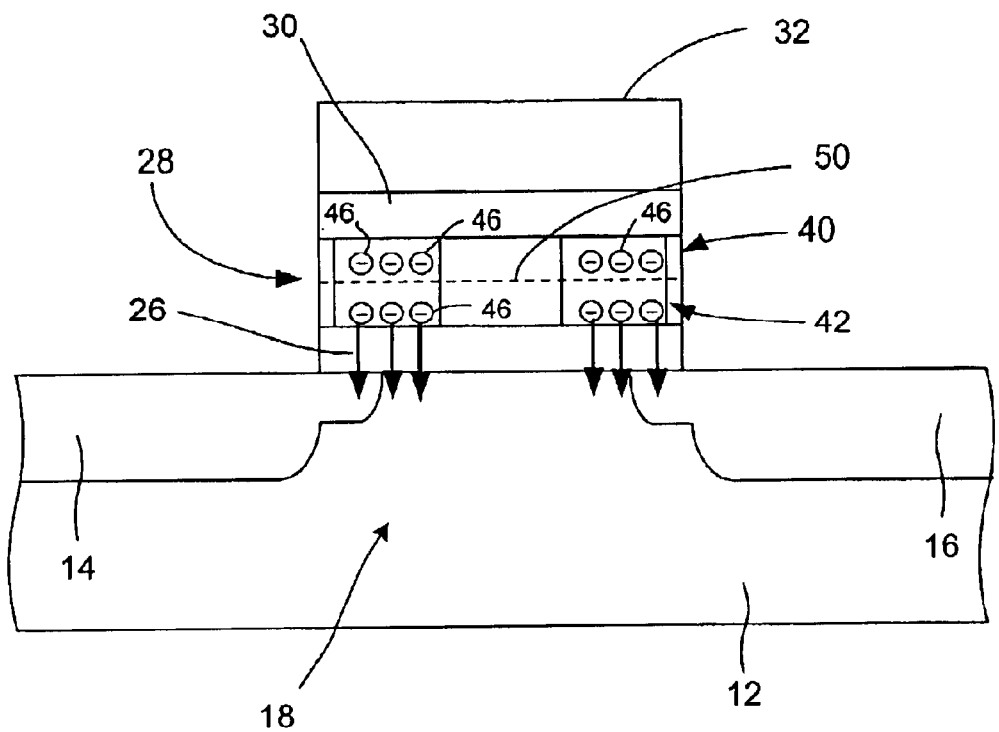
FIG. 4 is a schematic cross-section illustration of the device of FIG. 2 illustrating the removal of electrons from a lower portion of the charge storing layer in response to a soft erase operation in accordance with the present invention.
Figure 5:
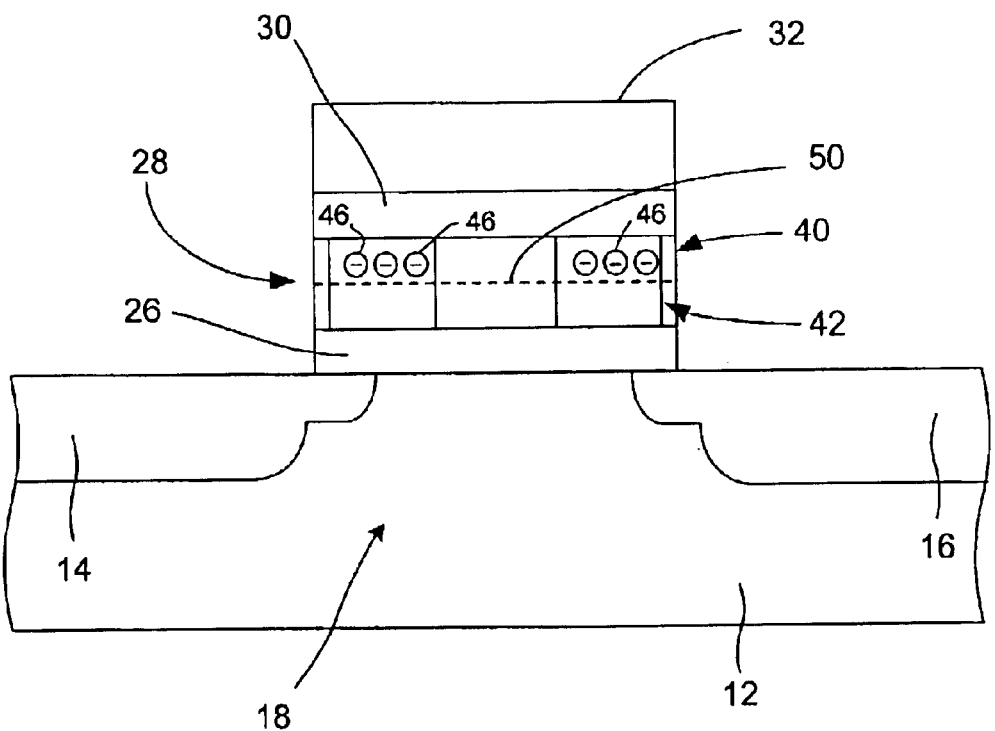
FIG. 5 is a schematic cross-section illustration of the device of FIG. 3 illustrating the distribution of electrons within an upper portion of the charge storing layer in response to a soft erase operation in accordance with the present invention.

As shown in FIGS. 4 and 5, the soft erase step 110 results in charge 46 being removed from the lower portion 42 of one or both of charge storing cells 36, 38 thereby leaving charge 46 within the upper portion of one or both of charge storing cells 36, 38. The application of soft erase pulses is effective to remove charge 46 from the lower portion 42 of each of the charge storing cells 36, 38, because this charge has a shorter distance to tunnel out of the charge storing cells 36, 38 due to the proximity of this charge to the interface with the bottom dielectric layer 26 or tunnel oxide.

In one embodiment, substantially all of the charge 46 is removed from the lower portion 42 of one or both of the charge storing cells 36, 38. Alternatively, the soft erase step 110 results in a substantial amount of charge 46 being removed from the lower portion 42 of one or both of the charge storing cells 36, 38. In one embodiment, for example, at least 75% or more of the charge 46 remaining in one or both of the charge storing cells 36, 38 remains in the upper portion 40 after the soft erase step. It is to be appreciated that this operation is effectively equivalent to selectively storing charge 46 within an upper portion 40 of one or more of the charge storing cells 36, 38.

In one embodiment, soft erase step 110 is followed by program verify step 120. Program verify step 120 includes a verify operation (i.e., a read operation under specified gate voltage and source-drain voltage conditions) to ensure that the desired program level is achieved. More specifically, in one embodiment, each charge storing cell 36, 38 is read or otherwise interrogated in a separate read operation in the reverse direction. For example, to read or otherwise verify the first charge storing cell 36, voltages can be applied to the gate electrode 32 (e.g., about 4 to about 5 volts) and the source 14 (e.g., about 1.2 volts), and the drain 16 can grounded or allowed to function as a virtual ground. The current drawn across the channel 20 during the read operation is then compared against a set of reference currents. In effect, at step 130, the threshold voltage of the memory device 10 is compared against one or more reference threshold voltages. The reference currents (or reference threshold voltages) can be generated by corresponding reference devices.

By comparing the threshold voltage of the memory device 10 against one or more reference threshold voltages (step 130), a determination can be made as to whether the first charge storing cell 36 has been programmed to the desired program level. If it is determined at step 130 that the threshold voltage is greater than or equal to one or more reference voltages, depending on the desired program level, the programming method is completed. In contrast, if it is determined at step 130 that the threshold voltage is less than one or more reference voltages, steps 100–130 are repeated until the desired program level is achieved.

It is to be appreciated that a similar procedure can be carried out to read or otherwise verify the program level of the second charge storing cell 38. More specifically, appropriate voltage potentials can be applied to the gate electrode 32 and the drain 16, while the source is grounded or allowed to function as a virtual ground. Thereafter, the threshold voltage of the memory device 10 is compared to one or more reference threshold voltages in the manner described above.

Again, as shown in FIG. 5, the programming method described herein facilitates storage of charge within an upper portion 40 of the charge storing layer 28. By selectively storing charge within the upper portion 40 of charge storing cells 36, 38, the memory device 10 will exhibit enhanced data retention due to the fact that localized charge near the bottom dielectric/charge storing layer interface is selectively removed, while charge corresponding to desired program levels is localized within the upper portion 40 of the charge storing layer 28.

Although particular embodiments of the invention have been described in detail, it is understood that the invention is not limited correspondingly in scope, but includes all changes, modifications and equivalents coming within the spirit and terms of the claims appended hereto.

What is claimed is:

1. A method of programming a memory device having a charge storing layer with a first charge storing cell and a second charge storing cell, the charge storing layer being disposed between a top dielectric layer and a bottom dielectric layer, said charge storing layer having an upper portion disposed adjacent the top dielectric layer and a lower portion disposed adjacent the bottom dielectric layer, and a gate electrode disposed over the top dielectric layer, the bottom dielectric layer disposed over a substrate having a first conductive region adjacent the first charge storing cell and a second conductive region adjacent the second charge storing cell, said method comprising:

programming the first charge storing cell by:
selectively storing charge in the upper portion of the first charge storing cell such that substantially all of the charge stored within the first charge storing cell resides within the upper portion and substantially no charge resides within the lower portion of the first charge storing cell.

2. The method according to claim 1, wherein the step of selectively storing charge in an upper portion of the first charge storing cell comprises:

applying voltage potentials to each of the first conductive region and the gate electrode to charge the first charge storing cell with a first charge; and performing a soft erase operation on the first charge storing cell, said soft erase operation selectively removing a portion of the first charge from a lower portion of the first charge storing cell.

3. The method according to claim 2, further comprising:
performing a first verification to determine whether the first charge storing cell is in a programmed state.

4. The method according to claim 3, further comprising:
repeating the steps of applying voltage potentials and performing a soft erase operation until the first charge storing cell is determined to be in a programmed state.

5. The method according to claim 3, wherein the step of performing a first verification comprises:
connecting the first conductive region to a zero potential;
applying voltage potentials to each of the second conductive region and the gate electrode; and
comparing a threshold voltage of the memory device against a reference voltage to determine whether the charge storing cell is charged to a programmed level.

6. The method according to claim 2, wherein the step of performing a soft erase operation comprises concurrently:
applying a negative voltage potential to the gate electrode; and
applying a positive voltage potential to the first conductive region.

7. The method according to claim 6, wherein the voltage potential applied to the gate electrode is in the range of about −4 volts to about −10 volts.

8. The method according to claim 7, wherein the voltage potential applied to the first conductive region is in the range of about 0 volts to about 2 volts.

9. The method according to claim 7, wherein applying a negative voltage potential to the gate electrode comprises applying an erase pulse having a duration in the range of about 1 ms to about 100 ms.

10. The method according to claim 1, further including:
   programming the second charge storing cell by:
      selectively storing charge in the upper portion of the second charge storing cell.

11. In a non-volatile memory device having a charge storing layer disposed between a top dielectric layer and a bottom dielectric layer, and a gate electrode disposed over the top dielectric layer, the bottom dielectric layer disposed over a substrate, and a source and a drain disposed within the substrate, a method of selectively storing charge within an upper portion of the charge storing layer, said method comprising:
   (a) performing a channel hot electron injection procedure, said channel hot electron injection procedure being operative to inject electrons into at least one charge storing cell within the charge storing layer, said at least one charge storing cell having an upper portion disposed adjacent the top dielectric layer and a bottom portion disposed adjacent the bottom dielectric layer; and
   (b) performing a soft erase procedure to selectively remove electrons from the bottom portion of the at least one charge storing cell.

12. The method according to claim 11, further comprising:
   (c) performing a verification procedure to determine whether the at least one charge storing cell is programmed to a desired program level; and
   (d) responsive to step (c), if the at least one charge storing cell is not programmed to the desired program level, repeating steps (a)–(c).

13. The method according to claim 12, wherein step (a) includes:
   applying a program voltage of about 9 volts to about 10 volts to the gate electrode;
   applying a voltage of about +4 volts to about +6 volts to the drain; and
   connecting the source to a zero potential.

14. The method according to claim 12, wherein step (b) includes:
   applying a negative potential to the gate electrode;
   applying a positive potential to the drain; and
   one of (i) grounding the source and (ii) floating the source.

15. The method according to claim 14, wherein the voltage potential applied to the gate electrode is between about −4 volts and about −10 volts.

16. The method according to claim 15, wherein the voltage potential applied to the drain is between about 0 volts and about +2 volts.

17. The method according to claim 16, wherein step (c) includes:
   connecting the drain to a zero potential;
   applying voltage potentials to each of the source and the gate electrode; and
   comparing a threshold voltage of the memory device against a reference voltage to determine whether the charge storing cell is charged to a programmed level.

* * * * *

UNITED STATES PATENT AND TRADEMARK OFFICE
CERTIFICATE OF CORRECTION

PATENT NO. : 6,744,675 B1
DATED : June 1, 2004
INVENTOR(S) : Zheng et al.

It is certified that error appears in the above-identified patent and that said Letters Patent is hereby corrected as shown below:

Column 1,
Line 14, replace "moderm" with -- modern --.

Signed and Sealed this

Twenty-first Day of December, 2004

JON W. DUDAS
*Director of the United States Patent and Trademark Office*